(12) United States Patent
Gamliel (10) Patent No.: US 8,344,818 B1
(45) Date of Patent: *Jan. 1, 2013

(54) SINGLE SIDE BAND (SSB) MIXER (75) Inventor: Doron Gamliel, Kiriat-Ata (IL)

(73) Assignee: Scientific Components Corporation, Brooklyn, NY (US)

( * ) Notice: Subject to any disclaimer, the term of this patent is extended or adjusted under 35 U.S.C. 154(b) by 1598 days.

This patent is subject to a terminal disclaimer.

(21) Appl. No.: 11/818,813

(22) Filed: Jun. 15, 2007

(51) Int. Cl.
*H03C 1/60* (2006.01)
*H04B 1/68* (2006.01)

(52) U.S. Cl. ........ 332/170; 375/277; 375/301; 375/321; 455/47; 455/109; 455/203; 455/323; 455/326; 455/333

(58) Field of Classification Search ............ 332/170; 375/277, 301, 321; 455/47, 109, 203, 323, 455/326, 333
See application file for complete search history.

(56) References Cited

U.S. PATENT DOCUMENTS

| | | |
|---|---|---|
| 3,913,037 A | 10/1975 | Himono et al. |
| 4,224,572 A | 9/1980 | Will |
| 4,979,233 A | 12/1990 | Kawahata |
| 5,006,811 A | 4/1991 | Kruger |
| 5,027,163 A | 6/1991 | Dobrovolny |
| 5,060,298 A | 10/1991 | Waugh et al. |
| 5,280,647 A | 1/1994 | Arai et al. |
| 5,280,648 A | 1/1994 | Dobrovolny |
| 5,361,409 A | 11/1994 | Vice |
| 5,513,390 A | 4/1996 | Vice |
| 5,534,830 A | 7/1996 | Ralph |
| 5,640,132 A | 6/1997 | Ralph |
| 5,640,699 A | 6/1997 | Ralph |
| 5,731,740 A | 3/1998 | van de Westerlo |
| 5,732,345 A | 3/1998 | Vice |
| 5,740,528 A | 4/1998 | Drennen |
| 5,774,801 A | 6/1998 | Li et al. |
| 5,799,248 A | 8/1998 | Vice |
| 5,854,974 A | 12/1998 | Li |
| 5,867,072 A | 2/1999 | Logothetis |
| 5,903,820 A | 5/1999 | Hagstrom |
| 5,987,315 A | 11/1999 | Nishida |
| 6,108,529 A | 8/2000 | Vice et al. |
| 6,140,892 A | 10/2000 | Uda et al. |
| 6,263,198 B1 | 7/2001 | Li |
| 6,275,687 B1 | 8/2001 | Lloyd |
| 6,278,872 B1 | 8/2001 | Poulin et al. |
| 6,317,590 B1 | 11/2001 | Nash et al. |
| 6,343,211 B1 | 1/2002 | Thodesen et al. |
| 6,348,830 B1 | 2/2002 | Rebeiz et al. |
| 6,427,069 B1 | 7/2002 | Galin |
| 6,438,563 B1 | 8/2002 | Kawagoe |
| 6,587,699 B2 | 7/2003 | Olsen et al. |
| 6,611,696 B2 | 8/2003 | Chedester et al. |
| 6,653,885 B2 | 11/2003 | Wu et al. |
| 6,653,910 B2 | 11/2003 | Escalera et al. |
| 6,665,546 B2 | 12/2003 | Slaughter et al. |
| 6,714,800 B2 | 3/2004 | Johnson et al. |
| 6,804,500 B2 | 10/2004 | Yamaguchi |
| 6,807,407 B2 | 10/2004 | Ji |

(Continued)

*Primary Examiner* — Levi Gannon
(74) *Attorney, Agent, or Firm* — Siegmar Silber, Esq.

(57) ABSTRACT

A single sideband mixer is constructed with digital logic elements such as T-type flip-flops and inverters and with FETs, and the resulting mixer circuit simultaneously improves control over the frequency resolution, noise floor and operating frequency range. The use of this group of elements also allows the mixer circuit to be easily realized in an integrated circuit.

14 Claims, 5 Drawing Sheets

U.S. PATENT DOCUMENTS

| | | |
|---|---|---|
| 6,917,796 B2 | 7/2005 | Setty et al. |
| 6,937,456 B2 | 8/2005 | Pasternak |
| 6,947,717 B2 | 9/2005 | Daxion |
| 6,957,055 B2 | 10/2005 | Gamliel |
| 6,959,180 B2 | 10/2005 | Ji |
| 7,013,122 B2 | 3/2006 | Gamliel |
| 7,027,795 B2 | 4/2006 | Ji |
| 7,072,636 B2 | 7/2006 | Dobrovolny |
| 7,305,217 B2 | 12/2007 | Kirkhart |
| 7,324,796 B2 | 1/2008 | Ji |
| 7,616,063 B1 * | 11/2009 | Gamliel ........................ 331/1 A |
| 7,680,474 B2 * | 3/2010 | Kirichenko et al. .......... 455/323 |

\* cited by examiner

| freq | dBm(RFout) |
|---|---|
| 0.0000 Hz | -39.559 |
| 100.0 kHz | -321.047 |
| 200.0 kHz | -54.005 |
| 300.0 kHz | -320.627 |
| 99.70 MHz | -47.338 |
| 99.80 MHz | -318.445 |
| 99.90 MHz | -11.554 |
| 100.0 MHz | -331.011 |
| 100.1 MHz | -66.807 |
| 100.2 MHz | -317.527 |
| 100.3 MHz | -51.766 |
| 199.8 MHz | -53.076 |
| 199.9 MHz | -322.291 |
| 200.0 MHz | -42.062 |
| 200.1 MHz | -324.546 |
| 200.2 MHz | -47.312 |
| 299.9 MHz | -39.846 |
| 300.0 MHz | -328.794 |
| 300.1 MHz | -23.756 |

| freq | ConvLoss |
|---|---|
| 99.90 MHz | -7.554 |

SINGLE SIDE BAND (SSB) MIXER

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

1. Field of the Invention

The present invention relates generally to mixer circuits and more particularly to a single side band mixer incorporating digital logic switching elements and field effect transistors (FETs) in order to accomplish signal mixing over a wide frequency range including direct current (DC) levels.

2. Description of the Prior Art

A mixer is an electronic circuit that performs frequency conversion by multiplying two signals, a function that is applicable to many areas of radio and other high frequency communications systems. The most prevalent use for a mixer circuit is in a radio circuit to obtain an intermediate frequency (IF) signal by multiplying a radio frequency (RF) signal by a local oscillator (LO) signal. The simplest mixer circuit uses a single diode, but for increased performance more sophisticated circuits are often used.

For high frequency applications, the two main types of mixers are switching mixers and nonlinear mixers. Switching mixers include both single balanced and double balanced types, and nonlinear mixers use a nonlinear device such as a schottky diode, field effect transistor (FET) or other transistor to perform the multiplication function. Switching mixers also require a nonlinear device for performing the mixing function. An advantage of the double balanced mixer is that it can isolate the two input signals from each other and from the output signal, thus allowing the bandwidths of the two input signals to overlap without producing noise in the form of spurious signal artifacts.

A mixer circuit has three terminals that in general use are identified as the radio frequency (RF) terminal, the local oscillator terminal (LO), and the intermediate frequency terminal (IF). The RF terminal is where the high frequency signal is applied when the desired output will be the IF signal at a lower frequency, also known as a downconverted signal, or where the high-frequency signal is output when an IF input signal is upconverted. The LO signal is generally the stronger input signal, and is used to modulate the FETs with a switching action that effectively reverses the path of the signal between the other two terminals. In the case of a downconverter, the IF terminal is where the RF signal that was modified by the LO signal is passed. In the case of an upconverter, the IF terminal and the LO terminal have the input signals that are multiplied to produce the higher frequency RF output signal.

As stated hereinabove, a mixer may be used to convert a signal down in frequency (as in a radio receiver) or up in frequency. When two sine waves are multiplied or beat against each other, the result includes both sum and difference frequencies. This can be expressed as:

$$\sin(\omega_1 t) \times \sin(\omega_2 t) = \frac{1}{2}\{\cos[(\omega_1-\omega_2)t] - \cos[(\omega_1+\omega_2)t]\}$$

In a single sideband (SSB) mixer, either the sum or the difference frequency will be used but not both. Efficient and complete removal of the unused frequency is necessary to prevent noise. A high-side mixer is one in which the LO is higher in frequency than the RF, a low-side mixer is one in which the LO is lower in frequency. When an SSB mixer is used in a downconverter or most receiver circuits, the conversion loss is the difference in amplitude of the available RF signal to the IF signal output. In an upconverter application, the conversion gain is the difference in amplitude from the IF signal to the RF signal.

Since the operation of a mixer depends on a nonlinear device, there are unavoidably some intermodulation products generated along with the desired output signal. Of particular concern are the third order intermodulation products, which in a receiver circuit are close in frequency to the fundamental IF frequency and thus are difficult to filter out. These products affect the maximum dynamic range for the mixer. The measurement used to define this maximum dynamic range is taken to be the point on a curve of the RF input versus the IF output where the desired output signal and the third order intermodulation products have equal amplitude as the RF input is raised. This point at which the power of the fundamental IF signal equals the power of the third order product is called the third order intercept point or IP3, and input IP3 is used as an important figure of merit for the quality of a mixer circuit. The output third order intercept point is defined as the difference between the input IP3 and the conversion loss, where higher conversion losses result in a lower output IP3.

An example of a double-balanced single sideband mixer with a high IP3 is taught by U.S. Pat. No. 6,957,055 entitled DOUBLE BALANCED FET MIXER WITH HIGH IP3 AND IF RESPONSE DOWN TO DC LEVELS. This circuit uses FETs as nonlinear elements to accomplish the mixer function, but also incorporates several balun transformers to allow a signal path down to DC. Having the circuit's IF frequency response reaching down to DC allows the mixer to be used in in-phase quadrature (I/Q) modulators, which are useful in circuits including certain types of phase-locked loops (PLLs).

SUMMARY

The improved single sideband mixer circuit described herein provides improved output noise floor and frequency resolution, and a wide frequency bandwidth while maintaining circuit simplicity, low component cost and low power consumption. This circuit is implemented with digital logic elements and FETs and can be entirely fabricated on an integrated circuit (IC) with standard IC fabrication processes.

The SSB mixer comprises a pair of quadrature generators and frequency dividers and a mixer-splitter circuit comprising a pair of mixers and a 2 way/0° splitter. Each quadrature generator is composed of an inverter and a pair of T-type flip-flops, and in response to a signal input produces signal outputs phase-shifted by 0°, 90°, 180° and 270°. These outputs are each at half the respective input frequency and are each fed into one of the mixers, and the mixer outputs are fed into the 2 way/0° splitter to produce the output signal. For receiver circuit use, the input signals are an RF signal and an LO signal, and the output is an IF signal. For uses such as an I/Q modulator, the inputs are an LO signal and an IF signal, and the output is an RF signal.

OBJECTS AND FEATURES OF THE INVENTION

It is an object of the present invention to provide a single sideband mixer circuit with a frequency bandwidth ranging from DC to at least 2000 MHz.

It is another object of the present invention to provide a single sideband mixer circuit with an improved noise floor.

It is still another object of the present invention to provide a single sideband mixer circuit with an improved frequency resolution.

It is a yet another object of the present invention to provide a single sideband mixer circuit capable of being fabricated on an integrated circuit.

It is a further object of the present invention to provide a single sideband mixer circuit that requires no balun transformers to operate.

It is a feature of the present invention to use quadrature generators, frequency dividers and mixer-splitter to realize the single sideband mixer circuit.

It is another feature of the present invention that the single sideband mixer circuit is realized by use of field effect transistors (FETs), digital logic inverters and T-type flip-flop gates.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENT AND BEST MODE

The invention described herein is a single sideband mixer circuit constructed from digital logic elements and FETs, and capable of being constructed entirely on an integrated circuit.

Figure 1:
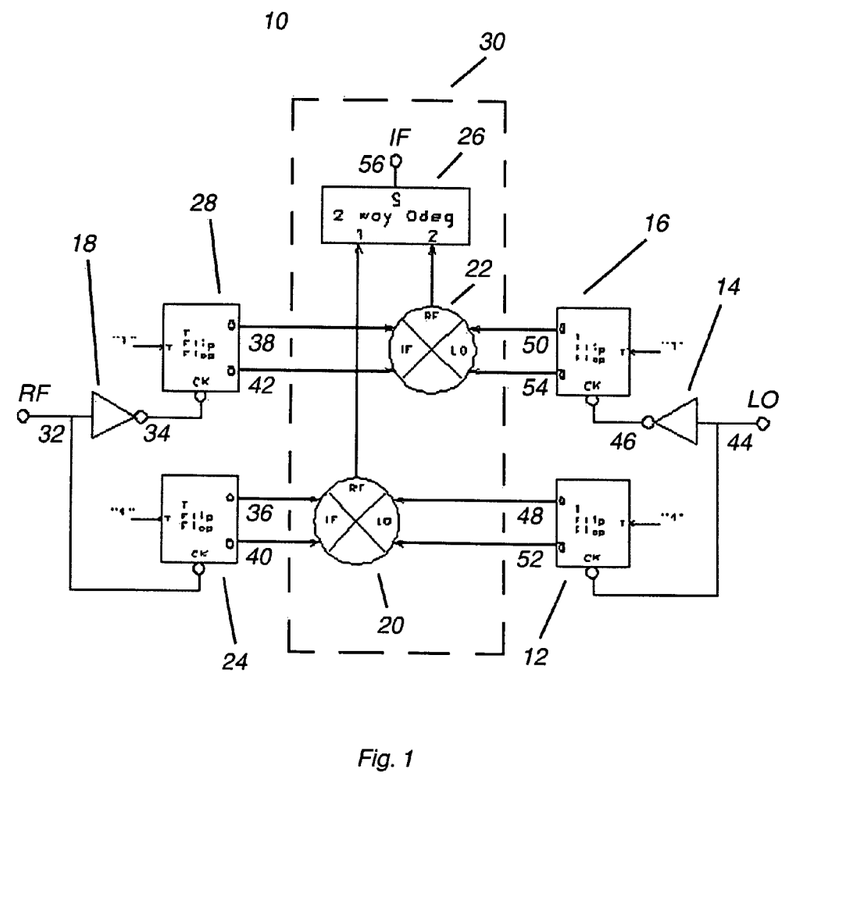
FIG. 1 is a block diagram of an SSB mixer incorporating T-type flip-flops therein.

The single side band mixer 10 circuit is shown in FIG. 1. There are two component groups each composed of an inverter and a pair of T flip-flops, wherein each component group functions as a quadrature generator to yield the output phase shifted by 0, 90, 180 and 270 degrees. This is performed for both the LO signal 44 and the RF signal 32. The LO signal 44 functions as a first terminal input and is fed into a first inverter 14, yielding an inverted LO signal 46. The LO signal 44 is also fed into the clock (CK) input of a first T flip-flop 12 yielding a 0 degree quadrature LO signal 48 and a 180 degree quadrature LO signal 52. (While the CK input is traditionally called a clock input, the use herein has no bearing on clock signals and the CK input is merely a useful input terminal.) The inverted LO signal 46 is fed into the CK input of a second T flip-flop 16 yielding a 90 degree quadrature LO signal 50 and a 270 degree quadrature LO signal 54. Likewise, the RF signal 32 functions as a second terminal input and is fed into a second inverter 18, yielding an inverted RF signal 34. The RF signal 32 is also fed into the CK input of a third T flip-flop 24 yielding a 0 degree quadrature RF signal 36 and a 180 degree quadrature RF signal 40. The inverted RF signal 34 is fed into the CK input of a fourth T flip-flop 28 yielding a 90 degree quadrature RF signal 38 and a 270 degree quadrature RF signal 42. These RF quadrature signals are at half the frequency of the RF signal 32 and are fed along with the LO quadrature signals at half the frequency of the LO signal 44 into a mixer-splitter circuit 30 constructed of a first mixer 20, a second mixer 22 and a combiner realized by a 2-way/0 degree splitter 26. The IF output frequency is either:

$$\frac{f_{LO} + f_{RF}}{2}$$

Or $$\frac{f_{LO} - f_{RF}}{2}$$

but it will not be both expressions at once.

Figure 2:
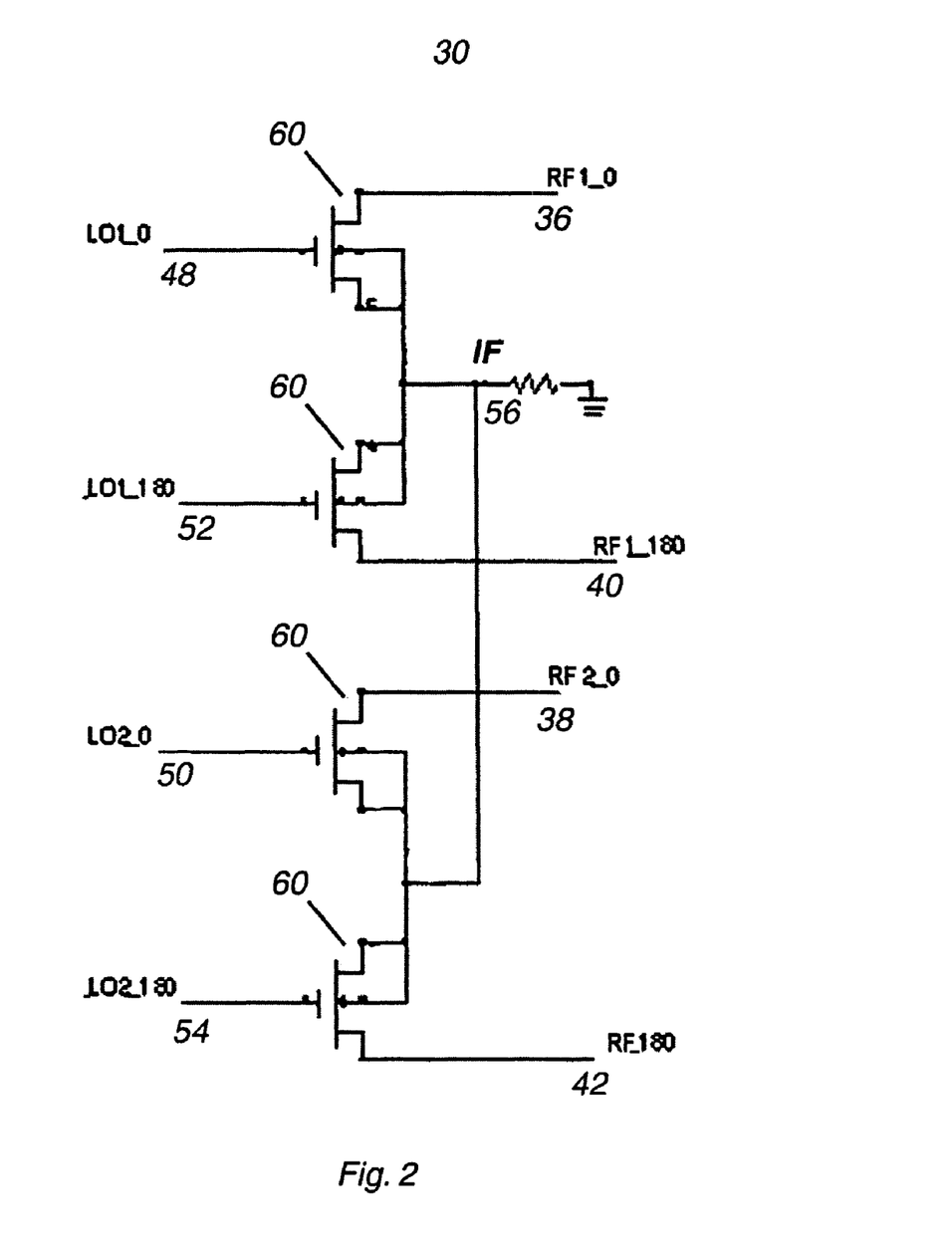
FIG. 2 is a circuit diagram showing the mixer and splitter elements of the SSB mixer of FIG. 1.

The mixer-splitter circuit 30 comprising a first mixer 20, a second mixer 22 and a combiner realized by a 2-way/0 degree splitter 26 is shown in a more essential component form in FIG. 2. The mixer and combiner functions are accomplished with four field effect transistors (FETs) 60 wherein the LO inputs are connected to the FET 60 gate terminals and the RF inputs are connected to the FET 60 drain terminals. (Note that the LO and RF inputs can be interchanged and the circuit will still function properly.) The FET 60 source terminals are connected together and to a load resistor referenced to ground. The signal seen at the load resistor is the IF signal 56, which functions as a third terminal output and is the signal output from the single sideband mixer circuit 10.

This SSB mixer circuit has advantages over the prior art including the ability to function from DC up to the lower of the maximum frequencies of the inverter and T flip-flops. Typical prior art SSB mixer circuits are only useful over a very narrow frequency band due to the limited bandwidth of the internal 90 degree splitters employed. The typical lower frequency to upper frequency ratio in these prior art SSB mixer circuits is on the order of 1.1:5.

Additional advantages result from this SSB mixer circuit being built of digital logic elements and FETs. The entire circuit can be realized in an integrated circuit, especially since the digital logic elements may in turn be composed of FETs. Since FETs are easily and economically fabricated in minimal space and in a wide range of IC fabrication processes, the entire circuit can be very cost-effective. Alternatively, the flip-flops and inverters, which in downconverters need to operate at higher frequencies than the FETs, can be fabricated in an IC process that includes the capability of producing higher speed logic elements such as Emitter-Coupled Logic (ECL) gates.

Prototyping and testing a circuit meant to be realized as a high-frequency integrated circuit out of discrete devices is an expensive and time-consuming task, and the physical realization has sources of error including mismatch between the discrete devices, mismatch between path lengths at higher frequencies and inaccurate frequency response due to disparities in actual versus intended device sizes. For many high-frequency circuit development applications, a more cost-effective and potentially more accurate way to evaluate circuit performance is the use of advanced computer models to simulate circuit performance.

An example of a high-frequency circuit modeling system is the Agilent Advanced Design System (ADS) which was created to assist with electronic design automation. Software of this type assists in the design of electronic circuitry intended to be incorporated in devices such as cellular and portable phones, pagers, wireless networks, and radar and satellite communications systems. In such a circuit modeling system, there are groups of equations for each type of circuit element. The user selects and connects the desired circuit elements, to which signal inputs are then applied and circuit response measured at selected nodes. The value and general methods of use of these modeling tools is well understood by persons of ordinary skill in the art.

Figure 3:
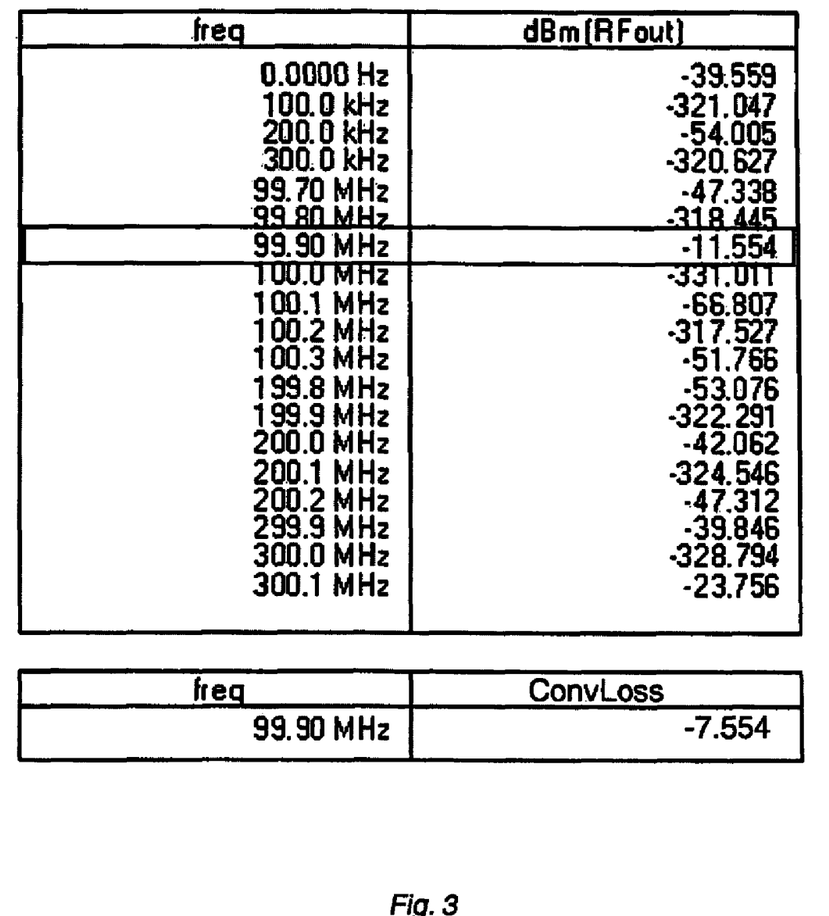
FIG. 3 is a chart showing the output power spectrum of the SSB mixer and the conversion loss at 99.9 MHz.

FIG. 3 shows an ADS computer simulation of the spectrum of the output power of the SSB mixer when used as an I/Q modulator. The output is shown in dBm, or dB referenced to 1 milliwatt. The four LO input frequencies are set to 100 MHz with a power of 17 dBm each and the four IF input frequencies are set to 0.1 MHz with a power of −10 dBm each. The sum of the four IF inputs feeding into the SSB mixer yield a total of −4 bBm. The desired RF out signal is 99.9 MHz, having a power of −11.554 dBm.

The ADS output display shown in FIG. 3 allows the user to select a given frequency for which to calculate conversion loss. The conversion loss (ConvLoss) is a measure of the efficiency of the mixer in providing translation between the input IF signals and the output RF signal, or IF power–RF power. In this case the ConvLoss at 99.9 MHz is −7.554 dB.

Figure 4:
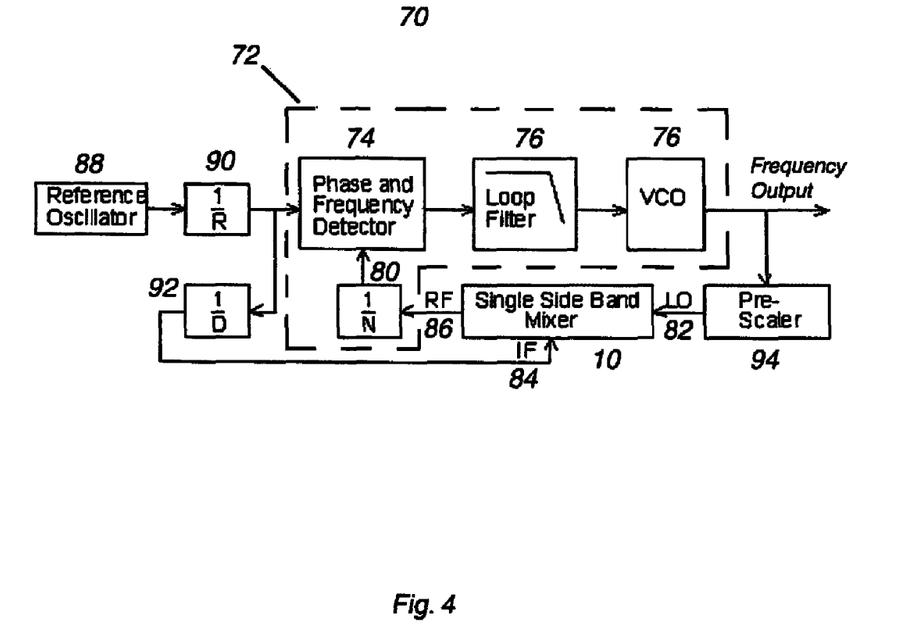
FIG. 4 is a circuit diagram showing the SSB mixer incorporated into a frequency synthesizer circuit.

One application for the SSB mixer circuit as an improved I/Q modulator is in frequency synthesizer circuits, as shown in FIG. 4 where the SSB mixer 10 is incorporated into the feedback loop of a PLL 72 as part of a frequency synthesizer 70. Note that in this application the IF signal 84 is an input and the RF signal 86 is an output. The 1/N 80 is an integer divider, the 1/R 90 is a reference divider and the 1/D 92 is an intermediate divider. It is common to use PLLs in frequency synthesizer circuits, where one of the technical challenges is maintaining an acceptable Output Noise Floor. For a given output frequency Fout, increasing the comparison frequency which is related to the output frequency by $$\text{Comparison\_Frequency} = \frac{Fref}{R} = \frac{Fout}{N}$$

improves the Output Noise Floor but simply increasing the comparison frequency to the maximum possible level has the disadvantage with a given PLL circuit of leading to a poor frequency resolution, as the comparison frequency also determines the frequency resolution of the frequency synthesizer.

In the past, an approach to resolving this problem has been to add an I/Q modulator between the output of the VCO 76 and the input of the integer divider 80. (Note that the VCO output is also identified as the frequency output signal for the frequency synthesizer.) An I/Q modulator functions by modulating two orthogonal data streams onto a common carrier. If the phases and amplitudes of both data stream (in-phase "I" and quadrature "Q"), then one of the sidebands is completely cancelled out. In this manner, the frequency resolution of the frequency synthesizer is the same as the I/Q modulator and can be as low as a few Hertz.

Disadvantages of adding a standard I/Q modulator into the circuit include difficulties in operating the I/Q modulator at high frequencies and generating the two 90 degree I/Q (quadrature) signals necessary for operation, as well as requiring a separate I/Q modulator for every frequency band.

A more versatile and robust approach is to replace the standard I/Q modulator with the single side band mixer 10. As shown in FIG. 4, the frequency synthesizer 70 feeds the Frequency Output signal from the VCO 76 into a pre-scaler 94 to produce the local oscillator (LO) signal 82. Additional components within this PLL 72 include a phase and frequency detector 74, a loop filter 76 and the integer divider 80. The pre-scaler is necessary if for example the PLL circuitry is composed of CMOS elements with a frequency limit in the range of hundreds of MHZ, and the PLL is operated at higher frequencies, including in the GHz range. A pre-scaler realized in a GaAs integrated circuit technology functions at these higher frequencies and converts the signal to a lower frequency range suitable for operation of the PLL. This is combined in the single side band mixer 10 with the intermediate frequency (IF) signal 84 output from an intermediate divider 92 that is fed by the output from the reference divider 90. This requires the PLL 72 to have the reference divider output available as an external signal, if the PLL 72 is an IC incorporating the reference divider 90. The IF and LO signals input to the single side band mixer 10 produce an RF signal 86 which is input to the integer divider 80. Ideally, the input signals applied to the SSB mixer 10 have a duty cycle of 50%. Note that the intermediate divider 92 may also be referred to as a D counter. The frequency resolution of this type of PLL circuit will be the RF, also stated as:

$$\text{Step\_Size} = \frac{Fcomp*N}{2*D} = \frac{Fout}{2*D}$$

Figure 5:
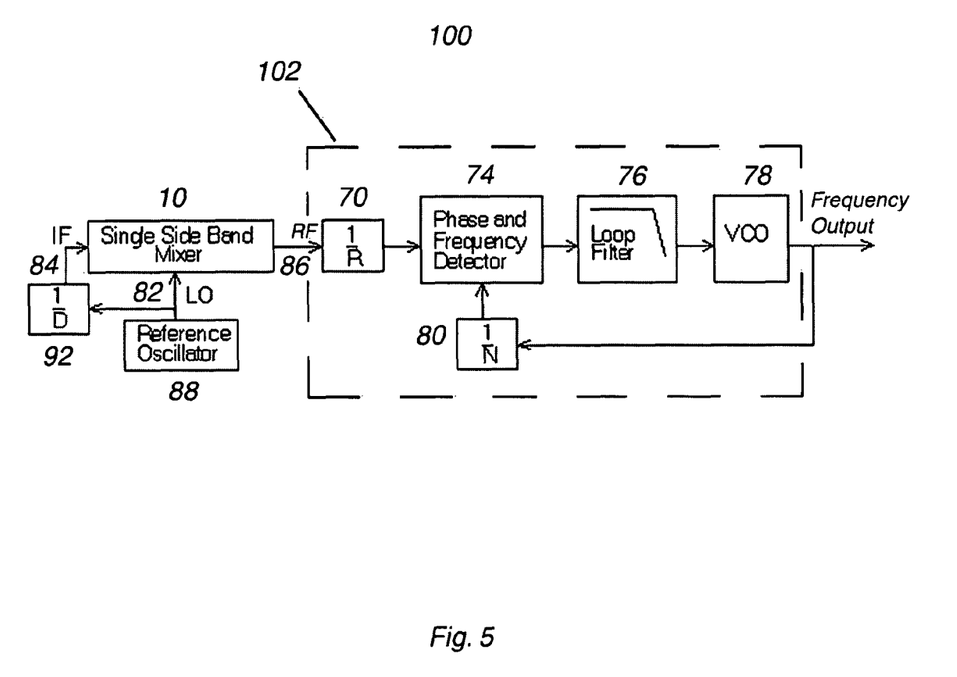
FIG. 5 is a circuit diagram showing the SSB mixer incorporated into a second frequency synthesizer circuit.

Another circuit incorporating the SSB mixer of the present invention as an I/Q modulator in a frequency synthesizer is shown in FIG. 5, wherein the frequency synthesizer 100 is more suitable for use with PLL ICs incorporating a reference divider 70 and either having or lacking a reference divider output. Additionally, the preferred embodiment does not require a pre-scaler. In the reference divider-included PLL 102 is shown, the modulation is performed on the reference input to the reference divider 70. The reference oscillator 88 outputs the LO signal 82 to the single side band mixer 10 and the intermediate divider 92. The intermediate divider 92 output is the IF signal 84 which is input to the SSB mixer 10, there combined with the LO signal 82 to output the RF signal 86 that is input to the PLL 102. As with the circuit topology incorporating the SSB mixer 10 into the feedback loop of the PLL 72, the IF is the frequency resolution of the frequency synthesizer.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A single sideband mixer comprising:
   a first terminal input, a second terminal input and a third terminal output;
   a first and a second T-type flip-flop having as inputs respectively said first terminal input and the inverse of said first terminal input;
   said first and second T-type flip-flops in combination producing a first group of quadrature outputs;
   a third and a fourth T-type flip-flop having as inputs respectively said second terminal input and the inverse of said second terminal input;

said third and fourth T-type flip-flops in combination producing a second group of quadrature outputs; and, a mixer-splitter circuit interconnected to said first and second groups of quadrature outputs, said mixer-splitter circuit producing a signal at said third terminal output proportional to a signal from the group consisting of the sum of the frequencies of said first terminal input and said second terminal input, and the difference of the frequencies of said first terminal input and said second terminal input.

2. A single sideband mixer as described in claim 1, wherein the outputs of said first, second, third and fourth T-type flip-flops comprise respectively:

a first 0 degree phase shifted signal and first 180 degree phase shifted signal;

a first 90 degree phase shifted signal and a first 270 degree phase shifted signal;

a second 0 degree phase shifted signal and a second 180 degree phase shifted signal; and, a second 90 degree phase shifted signal and a second 270 degree phase shifted signal.

3. A single sideband mixer as described in claim 1, wherein said mixer-splitter circuit comprises:

a first mixer circuit connected to the first T-type flip-flop quadrature outputs and the third T-type flip-flop quadrature outputs, producing a first mixer circuit output;

a second mixer circuit connected to the second T-type flip-flop quadrature outputs and the fourth T-type flip-flop quadrature outputs, producing a second mixer circuit output; and, a 2 way 0 degree splitter connected to said first mixer circuit output and said second mixer circuit output and producing said third terminal output.

4. A single sideband mixer as described in claim 3, wherein said mixer-splitter circuit further comprises:

a first FET with a first FET gate terminal, a first FET drain terminal a first FET source terminal;

said first 0 degree phase shifted signal connected to said first FET gate terminal and said second 0 degree phase shifted signal connected to said first FET drain terminal;

a second FET with a second FET gate terminal, a second FET drain terminal and a second FET source terminal;

said first 180 degree phase shifted signal connected to said second FET gate terminal and said second 180 degree phase shifted signal connected to a said second FET drain terminal;

a third FET with a third FET gate terminal, a third FET drain terminal and a third FET source terminal;

said first 90 degree phase shifted signal connected to said third FET gate terminal and said second 90 degree phase shifted signal connected to said third FET drain terminal;

a fourth FET with a fourth FET gate terminal, a fourth FET drain terminal and a fourth FET source terminal;

said first 270 degree phase shifted signal connected to said fourth FET gate terminal and said second 270 degree phase shifted signal connected to said fourth FET drain terminal; and, said first, second, third and fourth FET source terminals connected commonly and to a load resistor, whereby said third terminal output signal is present as a voltage across said load resister.

5. A single sideband mixer as described in claim 4, wherein said single sideband mixer is incorporated into an integrated circuit.

6. A single sideband mixer as described in claim 5, wherein said single sideband mixer is fabricated primarily of FET devices.

7. A single sideband mixer as described in claim 5, wherein portions of said single sideband mixer are fabricated with high-speed logic gates.

8. A single sideband mixer as described in claim 1 wherein the frequency operating range of said single sideband mixer extends down to DC levels.

9. A single sideband mixer as described in claim 1 wherein said single sideband mixer is part of a circuit containing elements selected from the group consisting of amplifiers, frequency filters, voltage references, phase locked loops and frequency synthesizers.

10. A single sideband mixer as described in claim 9 wherein said circuit is fabricated as an integrated circuit.

11. A single sideband mixer as described in claim 1 wherein said first terminal is a radio frequency (RF) terminal, said second terminal is a local oscillator (LO) terminal and said third terminal is an intermediate frequency (IF) terminal.

12. A single sideband mixer as described in claim 1 wherein said first terminal is a local oscillator (LO) terminal, said second terminal is an intermediate frequency (IF) terminal and said third terminal is a radio frequency (RF) terminal.

13. A single sideband mixer as described in claim 12 wherein said single sideband mixer functions as an I/Q modulator.

14. A single sideband mixer comprising:

a first terminal input, a second terminal input and a third terminal output;

a first inverter connected to said first terminal input and having a first inverter output;

a second inverter connected to said second terminal input and having a second inverter output;

a first T-type flip-flop having a first clock (CK) input and a first T input, a second T-type flip-flop having a second CK input and a second T input, said first terminal input and said first inverter output connected respectively to said first and second CK inputs;

a "1" logic signal connected respectively to said first and second T inputs;

said first and second T-type flip-flops in combination producing a first group of quadrature outputs;

a third T-type flip-flop having a third CK input and a third T input, and a fourth T-type flip-flop having a fourth CK input and a fourth T input, said second terminal input and said second inverter output connected respectively to said third and fourth CK inputs;

said "1" logic signal connected respectively to said third and fourth T inputs;

said third and fourth T-type flip-flops in combination producing a second group of quadrature outputs;

the outputs of said first, second, third and fourth T-type flip-flops comprising respectively a first 0 degree phase shifted signal and a first 180 degree phase shifted signal, a first 90 degree phase shifted signal and a first 270 degree phase shifted signal, a second 0 degree phase shifted signal and a second 180 degree phase shifted signal, and a second 90 degree phase signal and a second 270 degree phase shifted signal;

a mixer-splitter circuit connected to said outputs of said first, second, third and fourth T-type flip-flops, said mixer-splitter circuit, in turn, comprising:
  a first FET with a first FET gate terminal, a first FET drain terminal and a first FET source terminal;
  said first 0 degree phase shifted signal connected to said first FET gate terminal and said second 0 degree phase shifted signal connected to said first FET drain terminal
  a second FET with a second FET gate terminal, a second FET drain terminal and a second FET source terminal;
  said first 180 degree phase shifted signal connected to said second FET gate terminal and said second 180 degree phase shifted signal connected to a second FET drain terminal;
  a third FET with a third FET gate terminal, a third FET drain terminal and a third FET source terminal;
  said first 90 degree phase shifted signal connected to said third FET gate terminal and said second 90 degree phase shifted signal connected to said third FET drain terminal;
  said fourth FET with a fourth FET gate terminal, a fourth FET drain terminal and a fourth FET source terminal;
  said first 270 degree phase shifted signal connected to said fourth FET gate terminal and said second 270 degree phase shifted signal connected to said fourth FET drain terminal; and,
  said first, second, third and fourth FET source terminals connected commonly and to a load resistor, whereby said third terminal output signal is present as a voltage across said load resistor.

* * * * *